United States Patent [19]

Vandersande et al.

[11] Patent Number: 5,712,448
[45] Date of Patent: Jan. 27, 1998

[54] COOLING DEVICE FEATURING THERMOELECTRIC AND DIAMOND MATERIALS FOR TEMPERATURE CONTROL OF HEAT-DISSIPATING DEVICES

[75] Inventors: Ian W. Vandersande, Upland; Richard Ewell, Altadena; Jean-Pierre Fleurial, Duarte, all of Calif.; Hylan B. Lyon, Dallas, Tex.

[73] Assignee: California Institute of Technology, Pasadena, Calif.

[21] Appl. No.: 598,193

[22] Filed: Feb. 7, 1996

[51] Int. Cl.$^6$ .......................... H01L 35/04; H01L 35/16; H01L 35/18; H01L 35/30
[52] U.S. Cl. .......................... 136/203; 136/201; 136/204; 136/224; 136/225; 136/237; 136/238; 136/240; 62/3.2; 62/3.3; 62/3.7
[58] Field of Search .................. 136/203, 204, 136/224, 225, 237, 238, 240, 201; 62/3.2, 3.3, 3.6, 3.7

[56] References Cited

U.S. PATENT DOCUMENTS

| 3,437,576 | 4/1969 | Nelson et al. | 204/192 |
|---|---|---|---|
| 3,528,893 | 9/1970 | Christie et al. | 204/38 |
| 3,635,037 | 1/1972 | Hubert | 62/3 |
| 3,859,143 | 1/1975 | Krebs | 136/205 |
| 3,988,171 | 10/1976 | Miller et al. | 136/237 |
| 4,238,957 | 12/1980 | Bailey et al. | 73/343 R |
| 4,253,515 | 3/1981 | Swiatosz | 165/61 |
| 4,402,185 | 9/1983 | Perchak | 62/3 |
| 4,489,742 | 12/1984 | Moore et al. | 136/203 |
| 4,704,872 | 11/1987 | Jones | 62/3 |
| 4,848,090 | 7/1989 | Peters | 62/3.3 |
| 4,855,810 | 8/1989 | Gelb et al. | 357/87 |
| 5,040,381 | 8/1991 | Hazen | 62/3.2 |
| 5,197,805 | 3/1993 | Wilson | 374/208 |
| 5,228,923 | 7/1993 | Hed | 136/208 |
| 5,298,084 | 3/1994 | Van Der Beck et al. | 136/230 |
| 5,415,699 | 5/1995 | Harman | 136/238 |
| 5,419,780 | 5/1995 | Suski | 136/205 |
| 5,429,680 | 7/1995 | Fuschetti | 136/203 |
| 5,457,342 | 10/1995 | Herbst, II | 257/712 |

FOREIGN PATENT DOCUMENTS

| 724838 | 12/1965 | Canada | 136/237 |
|---|---|---|---|
| 2097184 | 10/1982 | United Kingdom | 62/3.3 |
| 2171254 | 8/1986 | United Kingdom | 136/237 |

Primary Examiner—Kathryn L. Gorgos
Assistant Examiner—Chrisman D. Carroll
Attorney, Agent, or Firm—Fish & Richardson P.C.

[57] ABSTRACT

A cooling device for lowering the temperature of a heat-dissipating device. The cooling device includes a heat-conducting substrate (composed, e.g., of diamond or another high thermal conductivity material) disposed in thermal contact with the heat-dissipating device. During operation, heat flows from the heat-dissipating device into the heat-conducting substrate, where it is spread out over a relatively large area. A thermoelectric cooling material (e.g., a $Bi_2Te_3$-based film or other thermoelectric material) is placed in thermal contact with the heat-conducting substrate. Application of electrical power to the thermoelectric material drives the thermoelectric material to pump heat into a second heat-conducting substrate which, in turn, is attached to a heat sink.

16 Claims, 4 Drawing Sheets

COOLING DEVICE FEATURING THERMOELECTRIC AND DIAMOND MATERIALS FOR TEMPERATURE CONTROL OF HEAT-DISSIPATING DEVICES

ORIGIN OF THE INVENTION

The invention described herein was made in the performance of work under a NASA contract, and is subject to the provisions of Public Law 96-517 (35 Title U.S.C. 202) in which the contractor has elected to retain title.

FIELD OF THE INVENTION

This invention relates to devices for cooling heat-dissipating devices.

BACKGROUND AND SUMMARY OF THE INVENTION

The performance levels of microelectronic devices (e.g., integrated circuits, power amplifiers) are continually increasing to keep pace with the demands of modern technology. Performance levels such as clock speed are closely tied to the number and density of features (e.g., transistors) patterned onto the microelectronic device. Faster processing by the microelectronic device demands faster clock speeds. Faster clock speeds, in turn, mean more switching and power dissipation per unit time.

Sub-micron transistors and other features are currently patterned onto silicon wafers with extremely high densities. For example, several million transistors can be patterned on a single square centimeter of silicon. switching speeds as fast as a few nanoseconds can be achieved with each transistor.

In theory, the performance levels of microelectronic devices should continually improve as the size of the transistors is decreased and the density of the features is increased. In practice, however, small, closely packed features dissipate large amounts of heat which limit performance levels. Heat is often dissipated from small, select regions of the device.

Temperature control has thus emerged as the limiting factor in the design of microelectronic devices. New-age devices, such as high-power amplifiers and multi-chip modules, radiate particularly large amounts of heat. Failure to effectively conduct away heat leaves these devices at high operating temperatures, ultimately resulting in decreased performance and reliability.

Electronic packaging materials, such as polyimide films and ceramic and diamond heat sink materials, are used to protect and cool devices dissipating small amounts of heat. These materials are thus designed to have high thermal conductivities and relatively high resistances to mechanical abrasion.

More elaborate mechanisms for temperature control, such as fans, air jets, and small-scale heat pipes, are used to conduct heat away from high-power microelectronic devices. Heat pipes are often mounted directly on the heat-dissipating device, whereas fans and air jets are disposed in close proximity to the device.

Cooling structures containing semiconducting, thermoelectric materials have also been used for temperature control. According to the known Peltier effect, thermoelectric materials pump heat from one region to another in response to an electric current. Thermoelectric materials are typically sandwiched between a pair of alumina (a well-known ceramic) substrates to form the cooling structure. Alumina is used in this configuration to electrically isolate the thermoelectric material from the device being cooled.

The Applicants have recognized that many conventional approaches to temperature control suffer shortcomings, especially when used to cool high-power electronic devices dissipating large amounts of heat. For example, components such as heat pipes and fans are typically expensive, cumbersome, and require electrical power. Current or voltage supplied to these components interferes with the electrical performance of the device being cooled.

Electronic packaging materials are often unable to lower the device's temperature to a desirable level. For example, polyimide films used in electronic packaging typically have low thermal conductivities. These materials are thus only effective in cooling low-power devices. Diamond and other materials having high thermal conductivities tend to cool the device uniformly, rather than selectively. In fact, prior techniques for temperature control have not been effective in cooling only the heat-dissipating regions of the device.

Cooling structures containing alumina substrates and thermoelectric materials are often ineffective for temperature control. Alumina has a relatively low thermal conductivity, and thus exhibits a large temperature gradient across its thickness when heated. Moreover, alumina's low thermal conductivity impedes distribution of heat within the substrate. Alumina is thus particularly ineffective in dissipating heat generated from a small area. Heat can concentrate in a "hot spot" in the alumina, resulting in a high heat flux density which cannot be effectively pumped away using the thermoelectric material.

To overcome these and other limitations, the Applicants have invented a cooling device featuring a heat-pumping component and a diamond substrate. Diamond is preferred because it has the highest thermal conductivity (about 2400 $Wm^{-1}K^{-1}$) of any known material. Diamond also has an extremely high degree of hardness, and is an excellent electrical insulator. Alternatively, a material having a high thermal conductivity can be used in place of the diamond substrate. A thermoelectric material, such as $Bi_2Te_3$ and $Bi_2Te_3$-based alloys (in bulk or film form), is preferably used as the heat-pumping component. A cooling device with this structure provides effective temperature control for microelectronic and other heat-dissipating devices. It is the operative correlation between the thermoelectric material and the diamond substrates which effectively cools the heat-dissipating device.

The thermoelectric $Bi_2Te_3$-based material is preferably disposed between a first and second diamond substrate. This material is patterned as a series of alternating n and p-type regions, or "legs", on the diamond substrates. The legs preferably have square or rectangular cross sections and are arranged in a two-dimensional "checkerboard" pattern so that they are electrically in series and thermally in parallel.

Films of $Bi_2Te_3$-based material deposited as legs on the diamond substrates typically have thicknesses of between 10–100 microns. Thicker legs are formed by slicing off layers (typically on the order of 1 mm–10 mm thick) from a polycrystalline or single crystalline ingot of a $Bi_2Te_3$-based material. These layers are then bonded in the checkerboard pattern to the diamond substrate. As the thermoelectric legs become thinner for a given temperature difference, the cooling power of the cooling device increases, while its cross-sectional area is maintained. This results in a higher cooling power density. Thin films of the thermoelectric material are therefore preferred if their thermal resistances or electrical contact resistances are low or negligible.

Materials having high-thermal conductivities, such as silicon carbide, aluminum nitride, boron nitride, or beryllium oxide, can be used in place of the diamond substrates. Other materials with similar electrical insulating and good thermally conducting properties (i.e., as close to diamond as possible) can also be used.

The desirable properties of diamond and materials having similar thermal properties enhance the effectiveness of the cooling device. During operation, heat is rapidly and evenly spread out so that the substrate functions as a "thermal lens" to facilitate cooling. The substrate's ability to spread the heat, coupled with its very high thermal conductivity, significantly reduces any temperature gradient therein. This ensures a uniform heat distribution and reduces the heat flux density in the substrate.

The thermoelectric material then pumps heat from a "cold side" contacted with the first substrate to a "hot side" contacted with the second substrate. There, the heat again spreads out due to the substrate's high thermal conductivity. This heat eventually flows into an external heat sink to cool the heat-dissipating device.

In this way, heat can be effectively removed from large or small regions of the heat-dissipating device. The special techniques described in this patent application are particularly effective in selectively cooling small regions in the heat-dissipating device.

The thermoelectric material is preferably placed in thermal contact with the first diamond substrate. Here, "thermal contact" and "thermally attached" can encompass any connection where heat easily flows from one material to another. This does not necessarily require that the materials be in direct contact. Preferably, a metallization layer (described below) is disposed between the diamond substrate and the thermoelectric material to ensure that these materials are in thermal contact or are thermally attached.

A multi-layer upper stack structure can be used to attach the thermoelectric material to the first diamond substrate. The stack structure preferably contains electrically and thermally conductive materials. Electrically conductive materials are required as they provide an in-series electrical connection between the p and n-doped legs of the thermoelectric material. A low electrical contact resistance between the electrically conductive materials and the thermoelectric legs is desirable. This reduces the total internal resistance of the cooling device and prevents degradation of its performance. Thermally conductive materials within the stack structure facilitate heat flow between the thermoelectric material and the diamond substrate. A low thermal resistance between the heat-dissipating device and the thermoelectric material reduces heat losses and the temperature gradient between the heat-dissipating device and the cold side of the thermoelectric cooler. These factors, taken in combination, prevent a degradation in the cooling device's performance. A lower stack structure having a similar multi-layer configuration (and similar electrical and thermal properties) connects the thermoelectric material to the second heat-conducting substrate.

A preferred upper stack structure includes a metallization layer coated on the inner surface of the diamond substrate. This thin metal coating facilitates adhesion of the diamond to other materials. In preferred embodiments, metals such as titanium or chromium are used as the metallization layers. An outer diffusion barrier layer, preferably composed of ternary alloys of Ta—Si—N, is then deposited on the metallization layer. A copper layer is deposited on the outer diffusion barrier layer. An inner diffusion barrier layer, preferably composed of nickel or aluminum, is then deposited on the copper layer. The inner diffusion barrier layer impedes the diffusion of copper (which has a high solid-state solubility and thus diffuses rapidly) into either the metallization layers or the thermoelectric material. Impeding the diffusion of copper prevents contamination of the other materials in the stack structure. An electrical contact layer, preferably including one of the transition metals, is deposited on the inner diffusion barrier layer to complete the upper stack structure.

P and n-doped thermoelectric legs of the desired thickness are then deposited or bonded on the electrical contact layer. A second electrical contact layer, followed by a second inner diffusion barrier layer, is deposited on the legs.

Thus, the upper stack structure contains metallization, outer diffusion barrier, copper, solder, inner diffusion barrier, and electrical contact layers. The lower stack structure is identical except for the absence of the solder.

Each layer of the stack structures is preferably deposited using semiconductor device fabrication techniques, such as electroplating, sputter deposition, and plasma deposition. The metallization, copper, and thermoelectric layers are typically deposited or attached in different reaction or sputtering chambers. Photolithography and spatially filtering masks are preferably used to pattern the layers.

Factors which limit the cooling capacity of the cooling device include: 1) the amount of current flowing through the thermoelectric legs; 2) the electrical contact resistance provided by the upper and lower stack structures; 3) the geometry and number of legs; and, 4) the thermal resistances for heat transfer at the hot and cold surfaces of the legs. An increase in the applied current will increase the amount of heat conducted by the thermoelectric material up to a maximum cooling power operating point.

The cooling device effectively lowers the temperature of a heat-dissipating region by a few degrees to several tens of degrees. Both small regions (e.g., the switching portion of a microprocessor) and large regions (e.g., the outer surface of a power amplifier) can be effectively cooled. Multiple heat-dissipating regions on a circuit board can be simultaneously cooled. At least one of the diamond substrates preferably contains a portion extending outside the perimeter of the heat-dissipating device. In this way, heat can be spread out and conducted away from a localized heat-sensitive regions.

The area of the first diamond substrate is preferably larger than the area of the heat-dissipating region being cooled. The area of the first diamond substrate and the thermoelectric material are preferably the same.

Preferably, the cooling device is in direct contact with the heat-dissipating region or device. Alternatively, the cooling device may be in contact with a thermally conducting material which, in turn, is in direct contact with the heat-dissipating device.

The cooling device can lower the operating temperature of any type of heat-dissipating device. In general, the cooling device will be effective in lowering the temperature of heat-dissipating devices which operate at high powers for short periods of time. In addition, the cooling device can be used with circuit boards to cool single heat-dissipating components which must operate at significantly lower temperatures than their neighboring components.

Other features of the invention will be evident from the following detailed description, and from the claims.

DETAILED DESCRIPTION

The cooling device according to the invention features a heat-pumping component, such as a thermoelectric material, operating in combination with a diamond or high-thermal conductivity heat-conducting material. Collectively, these materials function to effectively cool select regions of a wide range of heat-dissipating devices.

In a preferred configuration, a first diamond substrate is placed in thermal contact with a heat-dissipating region of a microelectronic device, such as a microprocessor. During operation, heat flows away from a heat-dissipating region of the microprocessor and into the diamond substrate. Heat confined to a small region is thus effectively spread out over a relatively larger area of the diamond substrate. This lowers the heat flux density. The spread-out heat is then pumped away from the diamond by the thermoelectric material.

The cooling device can thus be made larger than the heat-dissipating region. In this case, heat is spread out by the diamond substrate, lowering the heat flux density that must be pumped away by the thermoelectric material. A particularly preferred embodiment of the cooling device lowers the temperature of only a portion of the heat-dissipating device. This has special advantages, as explained herein.

More modern microprocessors have distinct and separated areas for switching, cache, and other purposes. The P6 processor family, for example, may have an entirely separate on-chip cache memory area. The processor generates very large amounts of heat when switching. However, this heat is generated primarily in a localized switching area; much less heat is typically generated in the cache area. According to the present invention, heat can be selectively cooled from the switching area without having to separately cool the cache area. This more effectively cools the microelectronic device, resulting in an increase in its performance and reliability.

Cooling Device Structure

Figure 1:
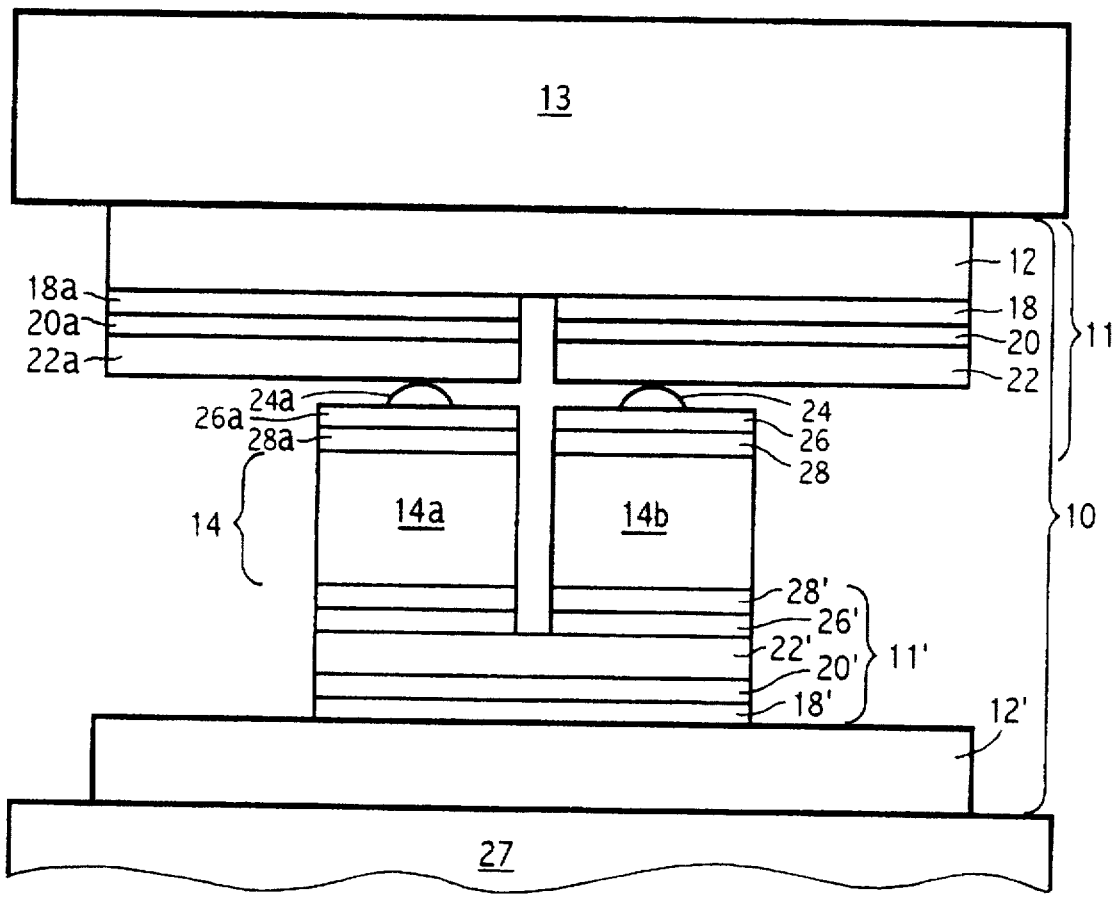
FIG. 1 is a cross-sectional side view of a cooling device of the invention featuring a pair of diamond substrates, upper and lower multi-layer stack structures, and a pair of thermoelectric legs.

FIG. 1 shows a particular cooling device 10 for lowering the temperature of an electronic device 13. The device 10 features upper 12 and lower 12' diamond substrates positioned over the top and bottom surfaces of a $Bi_2Te_3$-based thermoelectric material 14. An external heat sink 27 is attached to the lower diamond substrate.

The thermoelectric material 14 is composed of adjacent, alternately spaced p-doped 14a and n-doped 14b legs of the $Bi_2Te_3$-based material. As described below, the p and n-doped legs are formed by doping $Bi_2Te_3$ alloys with suitable elements. Each leg is separated from the diamond substrates by upper 11 and lower 11' multi-layer stack structures. The upper stack structure 11 includes metallization layers 18, 18a for metallizing a portion of the upper diamond substrate's bottom surface. The metallization layers 18, 18a facilitate adhesion between the diamond substrate and subsequent layers of the upper stack structure 11. In preferred embodiments, the metallization layers include titanium, chromium, or any other metallic material which can be used to bond subsequent layers.

Outer diffusion barrier layers 20, 20a are sandwiched between the metallization layers 18, 18a and copper layers 22, 22a. Copper has a high electrical conductivity, and thus can be used to supply current to the p and n-doped thermoelectric legs. Copper is also an excellent thermal conductor and is used during operation to conduct heat from the upper diamond substrate to the thermoelectric material. The outer diffusion barrier layers 20, 20a prevent the diffusion of copper into the diamond metallization layers. These layers preferably include ternary alloys of Ti—Si—N or any other material in which copper has a low solid solubility.

The copper layers 22, 22a are connected via solder 24, 24a to inner diffusion barrier layers 26, 26a. A wide range of metal alloys can be used as solder, with lead, tin, and indium alloys being preferred. Copper provides a solder-wettable surface when coated with a thin layer of nickel or palladium, and thus it may be desirable to deposit one of these materials prior to forming the solder.

The inner diffusion barrier layers are attached to electrical contact layers 28, 28a disposed on the upper surfaces of the p and n-doped legs 14a, 14b. The inner diffusion barrier layers impede the diffusion of the copper into the thermoelectric material. This is particularly important for $Bi_2Te_3$-based materials, which are easily contaminated with trace amounts of foreign material. The inner diffusion barrier layers also effectively impede the out-diffusion of thermoelectric material into the copper and diamond metallization layers. Preferably, these layers are "atomically opaque", meaning that atomic species are not readily diffused therein. Preferred materials for the inner diffusion barrier layers are nickel and aluminum. These materials are thermodynamically stable with respect to copper and, due to the lack of grain boundaries, do not contain diffusion paths which facilitate the passing of contaminants.

The electrical contact layers 28, 28a form ohmic junctions with the thermoelectric legs. It is preferable that these layers have low electrical resistivity to prevent a decrease in performance of the cooling device. The electrical contact layers must also have substantial mechanical stability to withstand operating conditions (e.g., thermal cycling) of the cooling device. Preferred low-resistivity materials for the contact layers include the transition metals.

The legs of the thermoelectric material are separated from the bottom diamond substrate 12' by a lower stack structure 11' similar to the upper stack structure 11. The lower stack structure includes an electrical contact layer 28', inner diffusion barrier layer 26', copper layer 22', outer diffusion barrier layer 20', and metallization layer 18'. These layers are attached to the lower diamond substrate 12'. The preferred materials used for these layers are the same as those described above.

The materials, thicknesses, and primary functions of each layer in the upper and lower stack structures of FIG. 1 are summarized in Table 1, below.

TABLE 1

Layers of the Cooling Device

| Layer | Ref. Numeral | Material | Thickness | Function |
|---|---|---|---|---|
| Heat conducting substrates | 12,12', 12a | diamond | 300 microns | thermal conductor |
| Metallization layers | 18,18', 18a | Ti,Cr | 0.02 microns | adhesion |
| Outer diffusion barrier layers | 20,20', 20a | Ta—Si—N | 0.1 microns | prevents diffusion of Cu into diamond |
| Cu layers | 22,22' 22a | Cu | 2–3 microns | thermal/ electrical conductor |
| Inner diffusion barrier layers | 26,26', 26a | Ni,Al | 0.1 microns | prevents diffusion of Cu into cooler |
| Electrical contact layers | 28,28', 28a | Trans. metals | 0.1 microns | electrical contact |
| Thermoelectric material | 14,14a, 14b | $Bi_2Te_3$ (n,p- doped) or alloys thereof | 5-100 microns | thermo- electric cooling |

Figure 2:
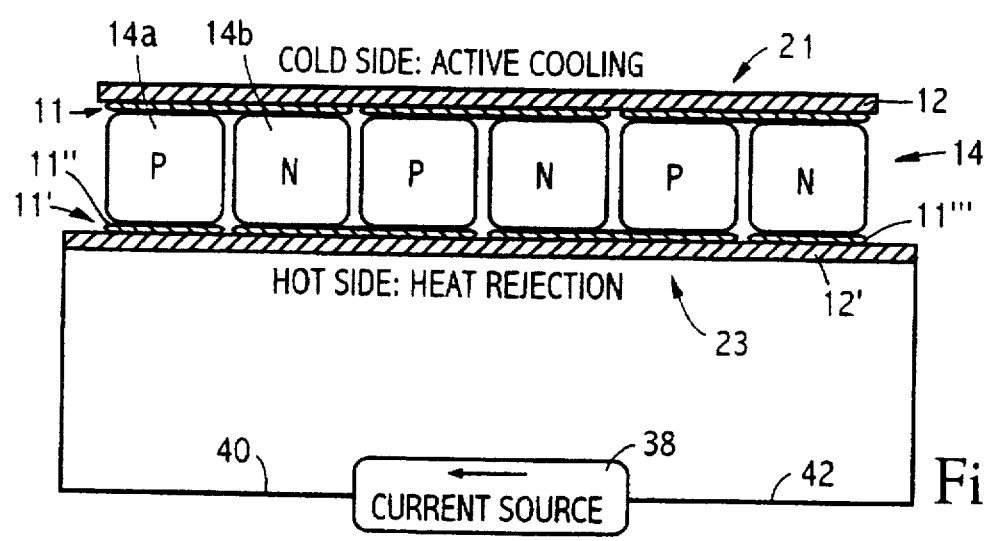
FIG. 2 is a cross-sectional side view of a thermoelectric cooling device with a series of thermoelectric legs according to the invention.

FIG. 2 shows a side view of the thermoelectric legs 14 and the upper 11 and lower 11' stack structures included in the cooling device 10 of FIG. 1. Diamond substrates 12, 12' are attached to the top and bottom surfaces of the device 10 using, respectively, the upper 11 and lower 11' stack structures. The legs 14 are a series of alternating p-doped 14a and n-doped 14b legs electrically connected in series by the upper 11 and lower 11' stack structures.

Current generated by a current source 38 passes through lead 40 to the first portion 11" of the lower stack structure 11'. Current flows from the lower stack structure 11', through the first p-doped leg 14a, and into the upper stack structure 11. The current then proceeds to pass through successive p-doped and n-doped legs, finally exiting through a portion 11''' of the lower stack structure 11'. The current then passes through lead 42 back to the current source 38 to complete the circuit.

Current passing through the legs in one direction (shown in the figure as clockwise) forces the thermoelectric material to pump heat away from the upper diamond substrate. This phenomenon occurs according to the known Peltier effect. As indicated by the figure, each p and n-doped leg of the thermoelectric material simultaneously pumps heat from its "cold" side 21, through the thermoelectric material, and to its "hot side" 23.

During operation, heat first passes from the electronic device to the upper diamond substrate 12. As described above, heat is rapidly spread out and conducted due to the high thermal conductivity of the diamond. This process distributes the heat and lowers the heat flux density. The cold side 21 of the thermoelectric material then actively pumps heat away from the diamond substrate and through the upper stack structure. Heat is pumped in parallel through the hot side 23 of the material, through the lower stack structure 11', and into the bottom diamond substrate 12'. Current flowing in the opposite direction (i.e., counter-clockwise) will cause the thermoelectric device to operate as a heater.

For a given temperature gradient, the cooling power density (i.e., the thermal power per unit area removed by the cooler) and the time required for thermoelectric legs to conduct away heat are inversely proportional to the leg thickness. Thus, thin (i.e., thicknesses of about 20 μm or less) thermoelectric legs have high cooling power densities and fast response times.

Cooling devices with relatively thin legs can require larger numbers of legs and electrical connections for operation. This can substantially increase the internal resistance within the cooling device and degrade its performance. The temperature gradient changes across the substrates due to thermal resistance can increase significantly as the thickness of the thermoelectric legs decrease. This decreases the efficiency of the cooling device. Use of high thermal conductivity substrates (e.g., diamond) to spread out and conduct away the heat is thus crucial for efficient operation of small-scale cooling devices.

The electrical and thermal properties of the upper and lower stack structures also affect the performance of the cooling device. As described above, the efficiency of the device decreases as the electrical contact resistance between the n and p-doped legs containing the thermoelectric material is increased. As the thickness of the thermoelectric material decreases, the development of ohmic contacts to the p and n-doped legs becomes a critical factor in determining the cooling performance. For instance, the electrical contact resistance between a thermoelectric leg and the stack structure is about $10^{-5}$ ohm-$cm^2$ for a cooling device having a leg thickness greater than 1 millimeter. However, for a cooling device with a leg thickness on the order of 10 microns, the electrical contact resistance between the stack structure and the leg must be reduced to about $10^{-6}$ ohm-$cm^2$ to prevent a substantial decrease in the maximum COP and the cooling power density of the device.

Similarly, an increase in the thermal resistance of the stack structure Will decrease the heat-flow rate between diamond and the thermoelectric material, thereby decreasing the cooling capacity of the device. Thermal resistance is typically minimized by forming good thermal contacts at the interfaces separating the diamond substrates and thermo-electric legs from the stack structures.

Figure 3A:
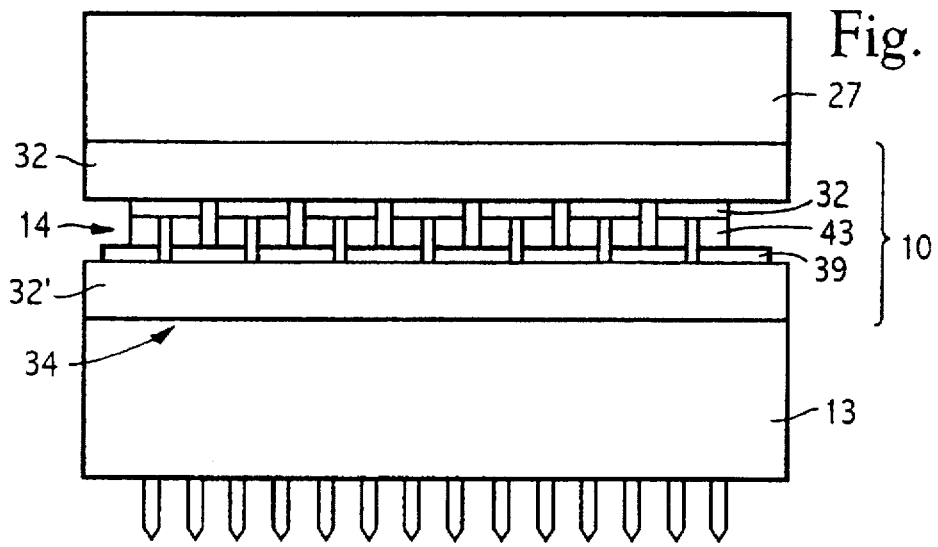
FIG. 3A is a cross-sectional side view of a cooling device of the invention disposed over the entire surface of a heat-dissipating electronic device.

FIG. 3A shows a cooling device 10 in thermal contact with an entire upper surface 34 of a heat-dissipating electronic device 13. The cooling device 10 features upper 32 and lower 32' diamond substrates positioned over the top and bottom surfaces of a series of thermoelectric legs 14. The upper diamond substrate 32 is in contact with an external heat sink 27. Upper 37 and lower 39 stack structures form electrical connections between the alternating p and n-doped legs 13. Here, it is assumed that the entire upper surface 34 of the electronic device generates heat during operation. The lower diamond substrate 32' of the cooling device is thus attached directly to the upper surface 34 to ensure maximum heat transfer between the heat-dissipating and cooling devices. Heat passes into the lower diamond substrate 32', and is pumped through the thermoelectric legs to the upper diamond substrate 32, where it flows into the heat sink 27. Covering the entire surface with the cooling device in this manner efficiently lowers the temperature of the electronic device, resulting in an increase in both its reliability and performance.

Figure 3B:
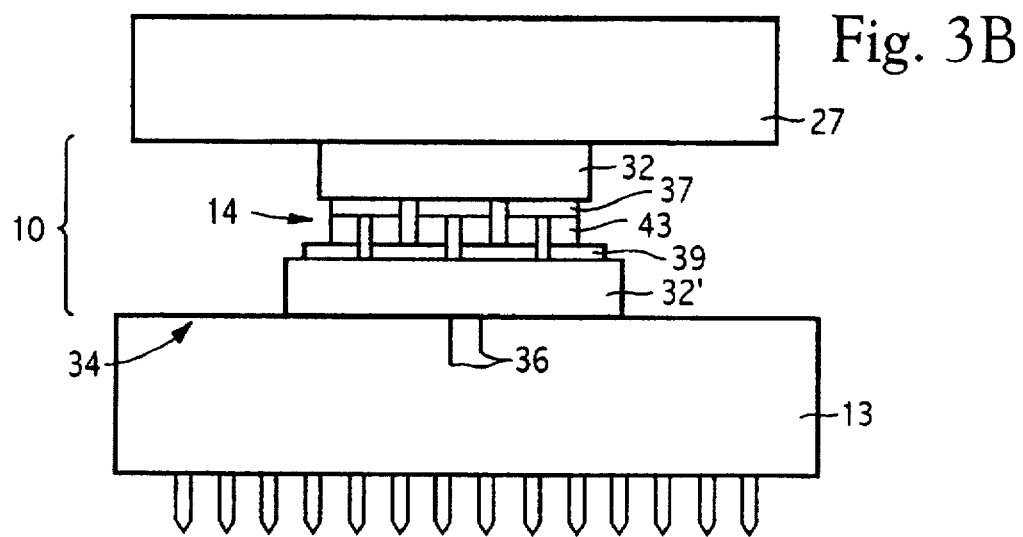
FIG. 3B is a cross-sectional side view of a cooling device of the invention disposed over an isolated heat-dissipating region of an electronic device.

FIG. 3B shows another embodiment in which the cooling device 10 is used to lower the temperature of a small, heat-dissipating region 36 on the surface 34 of the heat-dissipating device 13. In this case, the cooling device 10 is positioned directly above the region 36. Heat from the small region 36 flows into the lower diamond substrate 32' and is spatially distributed over a relatively large area due to the high thermal conductivity of the diamond. Thus, the substrate acts as a "thermal lens" to spread heat over an area comparable to that occupied by the thermoelectric legs 14. This process lowers the heat flux density in the diamond. The thermoelectric legs then pump heat away from the lower substrate 32' and into the upper diamond substrate 32. There, heat flows into the heat sink 27, thus cooling the heat-dissipating region.

Figure 4:
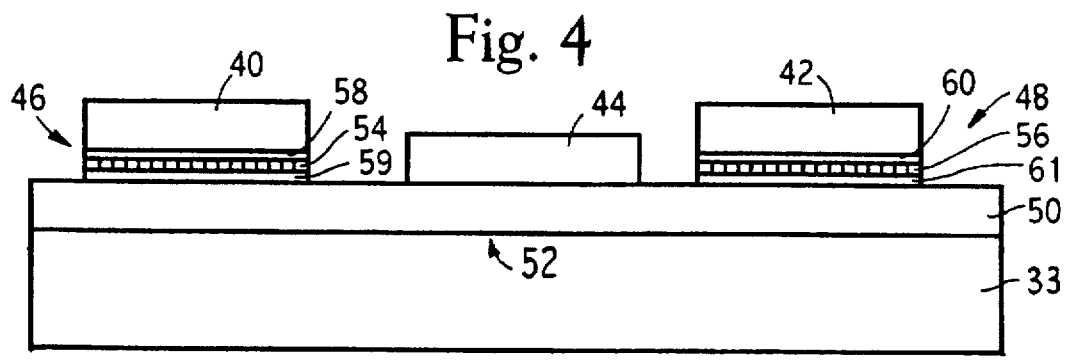
FIG. 4 is cross-sectional side view of a circuit board featuring two cooling devices of the invention in thermal contact with two isolated heat-dissipating electronic devices.

FIG. 4 shows yet another embodiment of the invention wherein a large-area lower diamond heat sink 50 is attached to a circuit board 33. The circuit board is used to mount two separate heat-dissipating devices 40, 42, and an additional device 44 which does not dissipate large amounts of heat. In this case, the lower diamond heat sink 50 spans the entire upper surface 52 of the circuit board 33. Separate cooling devices 46, 48, each containing thermoelectric legs 54, 56 and upper 58, 60 and lower 59, 61 diamond substrates are individually placed in thermal contact with the heat-dissipating devices 40, 42. During operation, heat separately passes from the devices 40, 42 into the upper diamond substrates 58, 60. The thermoelectric legs 54, 56 pump the heat into the large-area lower diamond substrates 59, 61. This heat then flows into the lower diamond heat sink, where it is dissipated towards its edges to cool the circuit board.

The cooling device of the invention can be used to lower the temperature of heat-dissipating electrical devices operating under both steady-state and transient conditions. Under transient conditions, the heat-dissipating electrical device only operates at high power levels for short periods of time. Current is supplied to the cooling device during discrete, well-defined periods synchronized with the transient operation of the electrical device. This effectively reduces temperature spikes in the heat-dissipating device to improve performance. During steady-state operation, the electrical device may continually dissipate heat for long periods of time. In this case, current is continually supplied to the cooling device to effectively remove heat from the electrical device.

Cooling Device Fabrication

The multi-layer stack structures shown in FIGS. 1-4 are fabricated by depositing (or mechanically attaching) the conducting, diffusion barrier, and thermoelectric layers described above on a diamond substrate. In general, all layers are formed and patterned using fabrication techniques commonly used in microelectronics. For example, metals are sputtered or plasma deposited in reaction chambers as films. The processes for forming the different layers of the stack structure (especially the metallization and copper layers) are typically not performed in the same reaction chamber. Likewise, the thermoelectric legs are typically deposited or attached to the stack structures using separate reaction chambers.

In a preferred fabrication method, the lower diamond substrate is metallized to improve its adhesion to the diffusion barrier layers of the multi-layer stack structure. Metallization is performed by depositing a thin metal film on a surface of the diamond. The metallization layer is followed by sequential deposition of the outer diffusion barrier, copper, inner diffusion barrier, electrical contact, thermoelectric material, electrical contact, diffusion barrier, and solder layers.

The upper diamond substrate is sequentially coated with metallization, diffusion barrier, and copper layers. These layers are preferably patterned on the upper diamond substrate at the same time that the lower diamond substrate is patterned. This can be done by placing the substrates side-by-side in the appropriate reaction chambers. As described above, deposition is preferably performed using plasma or sputter deposition. The desired pattern of each film is then obtained using spatially filtering masks, photolithography, and etchants commonly used in microelectronics fabrication.

The upper and lower diamond substrates are stacked on top of each other and aligned once the appropriate layers are formed and patterned. The substrates are then heated to a temperature which solders the copper layer of the upper diamond substrate to the exposed inner diffusion barrier layer of the lower diamond substrate. Conventional soldering or brazing is not the preferred method for attaching the copper and diffusion barrier layers due to the small size of the doped legs. More preferably, solder is electroplated on a region of each copper layer prior to attaching the solder. On heating to its melting temperature, the solder collapses and fuses the copper and diffusion barrier layers. Surface tension of the molten solder prevents bridging between the neighboring doped legs of the thermoelectric material, thereby reducing the probability of electrical shorting during operation.

Thermoelectric $Bi_2Te_3$-based alloys can be deposited as a film using the flash-evaporation method. In this technique, the $Bi_2Te_3$-based material in the form of fine grains is fed into a high-temperature heating chamber. The chamber is then evacuated and heated to the desired temperature. n-type $Bi_2Te_3$ can be grown by introducing an additional chalcogen source, such as bismuth, tellurium, or selenium, into the heating chamber. The stoichiometric amount of chalcogen can be varied by adjusting the temperature (and thus the vapor pressure) of the source material. Similarly, p-doped films can be grown by introducing additional bismuth, strontium, or tellurium to the source material, and by adjusting the temperature accordingly. Films having thicknesses on the order of a few microns can be formed with this method.

In other embodiments, the hot-wall method is used to generate the $Bi_2Te_3$-based film. This technique is used to deposit films having thicknesses as high as about 30 μm. Here, the material to be evaporated is placed in a quartz tube located inside a vacuum chamber. A substrate and solid $Bi_2Te_3$-based material are placed, respectively, in the top and bottom portions of the tube. The substrate, tube walls, and $Bi_2Te_3$-based material are then heated to a temperature which causes the thermoelectric material to evaporate and form on the surface of the substrate. Individual n and p-doped materials are formed by feeding the appropriate doped material in bulk form in the chamber.

Thermoelectric films may also be deposited on the stack structures using other well-known techniques, such as electrochemical deposition.

The patterns of the thermoelectric legs are isolated to assure that current flow only occurs in the spaces between the doped legs. Preferably, a "checker-board" pattern is formed. Typical spacing between the legs is between 5 and 25 microns. A typical cross section of both the n and p-doped legs within this pattern is 50×50 microns.

Bulk thermoelectric legs are preferably formed by slicing off layers from a polycrystalline or single crystalline ingot of a $Bi_2Te_3$-based material. Techniques well known in the art can be used to slice off layers on the order of 1 mm–10 mm thick. The layers are then bonded to the stack structures to form the appropriate pattern.

Diamond substrates (300 microns to 1 mm thick) can be obtained from a number of commercially available sources (e.g., Norton, Diamonex, Crystalline Materials, and General Electric).

Performance of the Cooling Device

The performance of the cooling device depends on the size of the thermoelectric legs, the number of legs, the temperature difference across the legs, the electrical contact resistance between these legs and the upper and lower stack structures, and the thermal resistance between the heat-dissipating device and the diamond substrate.

Figure 5:
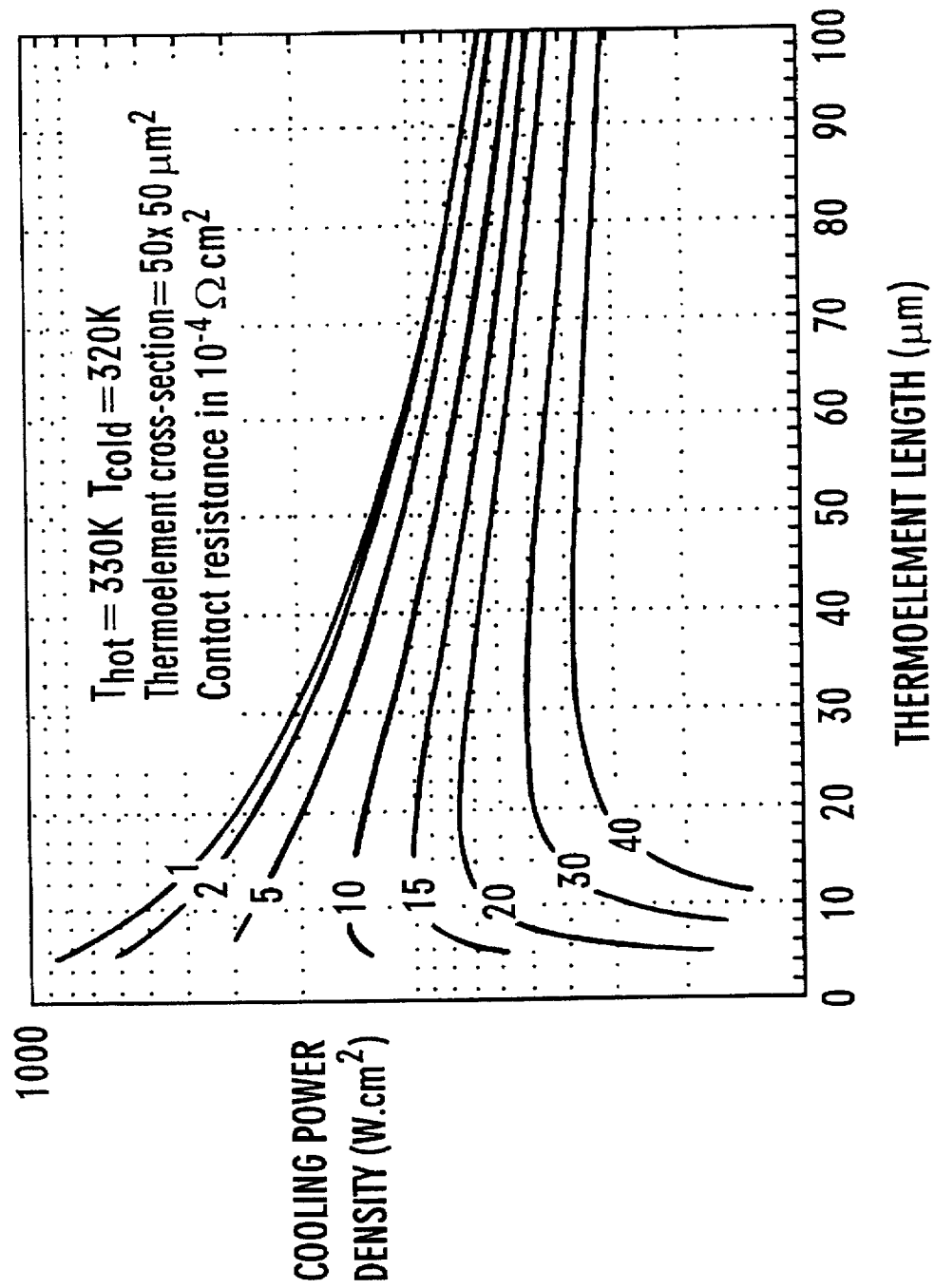
FIG. 5 is a plot of cooling power density of a $Bi_2Te_3$-based cooling device as a function of the thickness of its p and n-doped legs and the electrical resistance of the stack structure; and, FIG. 6 is a plot of the cooling power density of a $Bi_2Te_3$-based cooling device as a function of the thickness of its p and n-doped thermoelectric legs and its coefficient of performance (COP).

FIG. 5 shows a plot of the cooling power density of a $Bi_2Te_3$-based cooling device calculated as a function of both the thickness of the thermoelectric legs and the electrical contact resistance between the legs and the stack structure. The cooling power densities are calculated assuming the cross-sectional area of both the p and n-doped legs is 50×50 microns$^2$ and the temperatures of the hot and cold sides of the legs are, respectively, 330K and 320K. The plot shows that for regions less than about 20 microns thick the cooling power density falls off rapidly as the contact resistance is increased. This effect is especially evident when the electrical contact resistance is about $10 \times 10^{-6}$ ohm cm$^2$ or greater. The dependence of the cooling power density on electrical contact resistance is much less dramatic when the thickness of the doped legs is greater than about 30 microns.

For electrical contact resistances less than about $5 \times 10^{-6}$ ohm cm$^2$, the cooling performance increases in a near-exponential fashion as the thicknesses of the thermoelectric legs decrease. Here, the increase in performance is especially pronounced when the thickness of the leg is less than about 10 microns. For electrical contact resistances greater than about $5 \times 10^{-6}$ ohm cm$^2$, the cooling performance peaks when the leg thickness is between about 10 and 40 microns. The cooling performance tails off slowly as the leg thickness is increased, and rapidly as the thickness is decreased.

Figure 6:
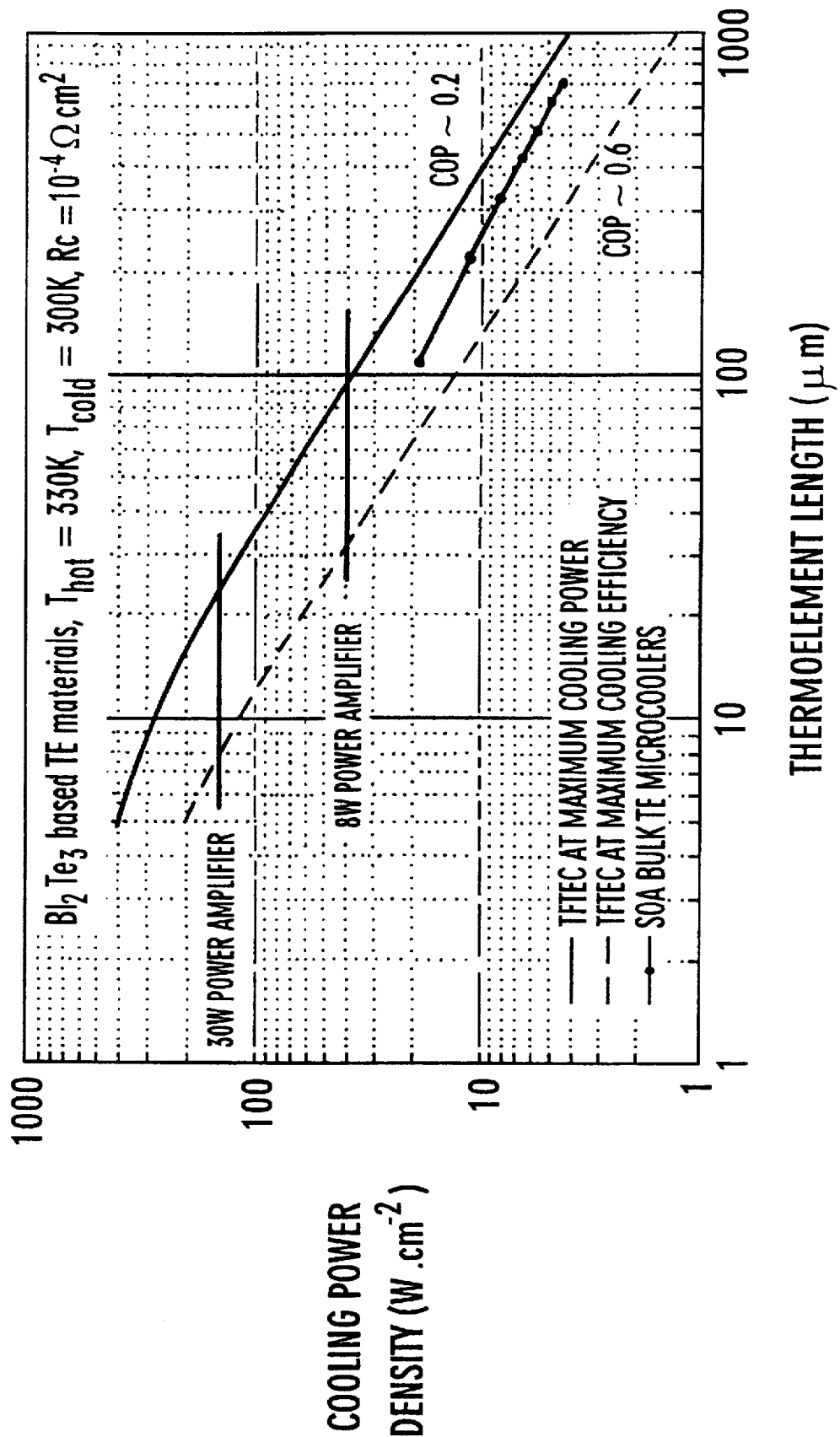

FIG. 6 shows a plot of cooling power density calculated as a function of thickness and coefficient of performance (COP, defined as the cooling power divided by the input electrical power) for a $Bi_2Te_3$-based cooling device. The calculations assume an electrical contact resistance of $1 \times 10^{-6}$ ohm cm$^2$. Hot and cold sides of the thermoelectric materials are assumed to be, respectively, 330K and 300K. In general, the calculations show that cooling power density decreases as the thickness of the legs is increased. The solid curve in the figure indicates a cooling device operating at maximum cooling power (relatively low COP and relatively high input current); the dashed curve indicates a device operating at maximum efficiency (relatively high COP and relatively low input current). Thus, a cooling device operating at maximum efficiency requires a leg thickness of about 30 microns to effectively cool an 8 W power amplifier. A leg thickness of about 100 microns is required to cool the same amplifier when the cooling device operates at maximum cooling power. Similarly, a leg having a thickness of 8 microns operating at maximum COP is required to cool a 30 W amplifier. The leg thickness must be increased to about 25 microns to cool the same 30 W device when the cooling device operates at its maximum cooling power.

Other Embodiments

Although only a few embodiments have been described in detail above, those having ordinary skill in the art will certainly understand that many modifications are possible in the preferred embodiment without departing from the teachings thereof. All such modifications are intended to be encompassed within the following claims. For example, other materials can be substituted for the $Bi_2Te_3$-based material to achieve different cooling performances and temperature ranges. Suitable materials preferably exhibit a ZT value greater than 1, where ZT is a figure of merit defined as:

$$ZT = \frac{S^2 T}{(\rho \cdot \lambda)} \qquad (1)$$

where S is the material's Seebeck coefficient, T is the operation temperature in Kelvin, $\rho$ is the electrical resistivity, and $\lambda$ is the thermal conductivity. In particular, a thermoelectric material with a ZT greater than the values for $Bi_2Te_3$-based alloys would allow a heat-dissipating region to be cooled to lower temperatures for the same COP. Less electrical power would be required to operate the device at the same temperature difference. Using a thermoelectric material with ZT values twice as high as these obtained for $Bi_2Te_3$ based alloys would increase the maximum COP by a factor of approximately 2 when the cooling device operates across a ΔT of 10° C.

In other embodiments, each of the materials listed in Table 1 may be replaced with another material having suitable electronic, thermal, and mechanical properties and substituted into the cooling device. The structures of the upper and lower stack structures can also be modified.

High-thermal conductivity materials, such as silicon carbide, or related materials, such as aluminum nitride, boron nitride, or beryllium oxide have properties close to those for diamond. In general, these materials are electrical insulators, have high thermal conductivities, and are durable enough to operate at temperatures in excess of about 350K. These materials can thus be used in the cooling device. Other materials having desirable thermal, mechanical, and electrical properties, such as ceramics or polymers, may also be used.

Still other embodiments are within the scope of the following claims.

What is claimed is:

1. A cooling device for cooling a heat-dissipating device, comprising:

a diamond or high thermal conductivity substrate in thermal contact with said heat-dissipating device to dissipate heat therefrom;

a heat-pumping element in thermal contact with said diamond or high thermal conductivity substrate, having thermoelectric components; and, a stack structure disposed between said diamond or high thermal conductivity substrate and said heat-pumping element, said stack structure comprising thermally and electrically conductive stack layers for supplying electrical current to said heat-pumping element and conducting heat from said diamond or high thermal conductivity substrate to said heat-pumping element, said stack layers including:

a metallization layer attached to a surface of said diamond or high thermal conductivity substrate;

an outer diffusion barrier layer attached to said metallization layer;

an electrically conducting layer attached to said diffusion barrier layer;

an inner diffusion barrier layer attached to said electrically conducting layer; and, a contact layer attached to said inner diffusion barrier layer.

2. The cooling device of claim 1, wherein said thermoelectric components form a thermoelectric film deposited directly onto said stack structure.

3. The cooling device of claim 2, wherein said thermoelectric film comprises p-doped regions and n-doped regions with each region having a thickness in an approximate range of a few microns to several hundred microns and a cross sectional dimension of about 50 microns.

4. The cooling device of claim 1, wherein said thermoelectric components form a thermoelectric layer bonded directly onto said stack structure.

5. The cooling device of claim 1, wherein said thermoelectric components are comprised by a series of alternating p and n-doped regions.

6. The cooling device of claim 5, wherein said each of said p-doped and n-doped regions in said alternating series are electrically connected in series.

7. The cooling device of claim 1, wherein said thermoelectric components include $Bi_2Te_3$ or a $Bi_2Te_3$-based alloy.

8. The cooling device of claim 1, wherein said diamond or high thermal conductivity substrate is attached directly to a heat-dissipating region of said heat-dissipating device.

9. The cooling device of claim 8, wherein said diamond or high thermal conductivity substrate covers an entire surface of said heat-dissipating device.

10. The cooling device of claim 8, wherein said diamond or high thermal conductivity substrate covers a select portion of said heat-dissipating device.

11. The cooling device of claim 1, wherein said diamond or high thermal conductivity substrate covers a portion of a circuit board onto which said heat-dissipating device is mounted.

12. The cooling device of claim 1, wherein said high thermal conductivity substrate is made of a material selected from the group consisting of silicon carbide, boron nitride, aluminum nitride, or beryllium oxide.

13. The cooling device of claim 1, wherein said stack structure is deposited directly onto said diamond or high thermal conductivity substrate.

14. The cooling device of claim 1, further comprising a second stack structure attached to said heat-pumping element, and a second heat-conducting substrate attached to said second stack structure.

15. A cooling device for cooling a heat-dissipating device, comprising:

a diamond or high thermal conductivity substrate in thermal contact with only a portion of a device to be cooled, and covering some amount less than an entire area of said device to be cooled, said diamond or high thermal conductivity substrate having an area which is larger than an area of said portion of the device to be cooled, said diamond or high thermal conductivity substrate including at least one portion which extends outside of a perimeter of said heat-dissipating device to spread the heat produced by said device to be cooled to an area larger than said portion and thereby spread some of the heat away from said portion;

a thermoelectric material in thermal contact with said diamond or high thermal conductivity substrate, said thermoelectric material including a material which pumps heat in response to an applied source of power to thereby cool said portion of said device to be cooled; and a stack structure disposed between said diamond or high thermal conductivity substrate and said thermoelectric material, said stack structure including:
a metallization layer attached to a surface of said diamond or high thermal conductivity substrate;
an outer diffusion barrier layer attached to said metallization layer;
an electrically conducting layer attached to said diffusion barrier layer;
an inner diffusion barrier layer attached to said electrically conducting layer; and,
a contact layer attached to said inner diffusion barrier layer.

16. A method of cooling a device to be cooled with a cooling device, comprising:

establishing a thermal connection between the device to be cooled and a diamond or high thermal conductivity substrate having an area which is larger than an area of said portion of the device to be cooled, said diamond or high thermal conductivity substrate including at least one portion which extends outside of a perimeter of said device to be cooled, said thermal connection including a stack structure comprising:
a metallization layer attached to a surface of said diamond or high thermal conductivity substrate;
an outer diffusion barrier layer attached to said metallization layer;
an electrically conducting layer attached to said diffusion barrier layer;
an inner diffusion barrier layer attached to said electrically conducting layer, and
a contact layer attached to said inner diffusion barrier layer;

using the diamond or high thermal conductivity substrate to spread the heat produced by said device to be cooled to an area larger than said portion and such that it spreads some of the heat away from said portion;

providing a thermoelectric cooling material in thermal contact with said diamond or high thermal conductivity substrate; and applying power to said thermoelectric cooling material in away such that heat from said device to be cooled is pumped from said diamond or high thermal conductivity substrate and through a portion of said thermoelectric cooling material.

* * * * *